United States Patent [19]

Ishii

[11] Patent Number: 5,170,157
[45] Date of Patent: Dec. 8, 1992

[54] MEMORY DEVICE FOR AN IMAGE DISPLAY APPARATUS HAVING A SERIAL PORT AND INDEPENDENTLY OPERABLE DATA REGISTERS

[76] Inventor: Takatoshi Ishii, c/o Ascii Corporation, 11-5, Minamiaoyama 5-chome, Minato-ku, Tokyo, Japan

[21] Appl. No.: 698,607

[22] Filed: May 10, 1991

Related U.S. Application Data

[63] Continuation of Ser. No. 549,612, Jul. 9, 1990, abandoned, which is a continuation of Ser. No. 49,806, May 13, 1987, abandoned.

[30] Foreign Application Priority Data

May 20, 1986 [JP] Japan .................. 61-115684

[51] Int. Cl.[5] ............. G09G 1/02; G11C 7/00
[52] U.S. Cl. ................... 340/799; 340/800; 365/189.12; 365/189.05; 395/425
[58] Field of Search ...... 364/518, 521, 200 MS File, 364/900 MS File, DIG. 1 MS, DIG. 2 MS; 340/798, 799, 800; 365/189.12, 189.05, 189.02; 395/164, 166

[56] References Cited

U.S. PATENT DOCUMENTS

| 4,639,890 | 1/1987 | Heilveil et al. | 364/900 |
| 4,689,741 | 8/1987 | Redwine et al. | 364/200 |
| 4,723,226 | 2/1988 | McDonough et al. | 340/799 X |
| 4,747,081 | 5/1988 | Heilveil et al. | 340/799 X |
| 4,796,231 | 1/1989 | Pinkham | 365/189 |

Primary Examiner—Gary V. Harkcom
Assistant Examiner—Raymond J. Bayerl

[57] ABSTRACT

A memory device utilized for an image display apparatus, such as a dual port memory. The memory device provides a serial port for performing a serial-access with a display controller and a random port for performing a random-access with a CPU. Such memory device includes memory cell arrays of M rows and N columns, one couple of data registers and pointers. The data stored in one row within the memory cell arrays are divided into data of K columns and another data of N-K columns. When the display controller performs the serial-access, one of the above two data registers can be alternatively used for serially inputting or outputting the data while the another data are transferred between the memory cell arrays and another data register. Or the data can be transferred between the memory cell arrays and both of two data registers. In this case, the serial input or output positions for determining the start addresses are assigned by the pointers. The data are read from or written into the data registers from the start addresses.

13 Claims, 7 Drawing Sheets

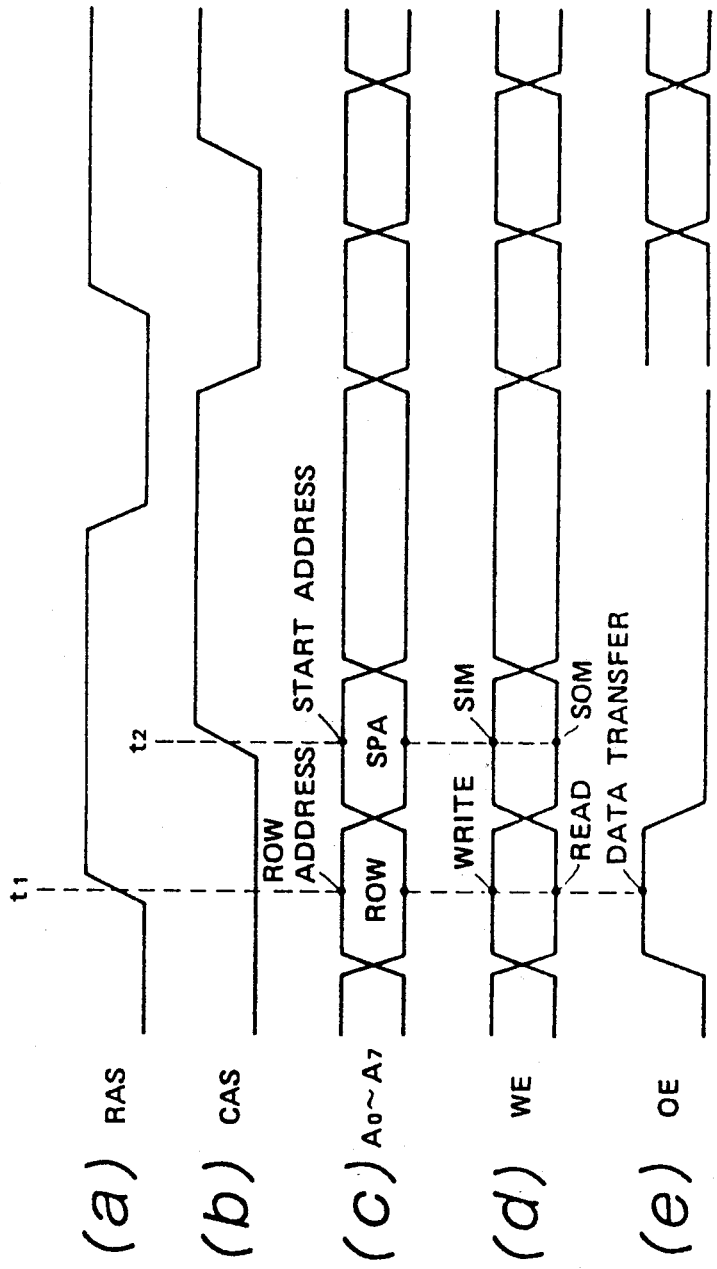

MEMORY DEVICE FOR AN IMAGE DISPLAY APPARATUS HAVING A SERIAL PORT AND INDEPENDENTLY OPERABLE DATA REGISTERS

This is a continuation of copending application Ser. No. 07/549,612 filed on Jul. 9, 1990, now abandoned, which is a continuation of Ser. No. 049,806 filed May 13, 1987 now abandoned.

BACKGROUND OF THE INVENTION

1. Field of the Invention

The present invention generally relates to memory devices, and more particularly to a memory device which is suitably applied for a frame buffer memory of an image display apparatus, for example.

2. Prior Art

The conventional image display apparatus comprises a frame buffer memory, a display controller and a display apparatus which employs a raster scan system. Image data including figure data, character data and the like are stored in the buffer memory based on commands from a CPU (a Central Processing Unit). The display controller successively reads out the image data from the buffer memory and outputs the image data to the display apparatus wherein an image according to the image data will be displayed on a screen thereof.

In the above image display apparatus, it is necessary to perform two kinds of accesses such as an access from the CPU and an access from the display controller. In this case, it is possible to employ a method in which the access from the CPU is permitted only in a blanking period of a horizontal scanning or a vertical scanning. In addition, it is possible to employ another method in which a memory access timing is divided into several time slots and specific time slots are assigned to the display controller and remaining time slots other than the specific time slots are assigned to the CPU.

However, the access from the CPU is considerably limited in both of above methods. Hence, the dual port memory is widely used and applied for performing the access from the CPU and the access from the display controller in parallel. This dual port memory has a random port and a serial port therein. And, it is possible to write in and read out data as a general RAM (Random Access Memory) via the random port, and it is also possible to input and output serial-data. Hereinafter, a series of data each of which are constituted by predetermined bits will be referred to as the serial-data, and an operation for inputting and outputting the serial-data based on serial-access will be referred to as "a serial I/O operation" in the present specification. Hence, the access from the CPU is performed by use of the random port, and the access from the display controller is performed by use of the serial port. This technique has been already disclosed in a magazine named "Nikkei Electronics" of May 20th. in 1985, no. 369, pp. 195 to pp. 219, for example.

FIG. 6 is a block diagram showing an example of the conventional dual port memory. In FIG. 6, 1 to 4 designate memory cell arrays each of which is constructed by memory cells of 256 rows and 256 columns. In the memory cell arrays 1 to 4, it is possible to perform an access in two kinds of modes including a random-access mode and a serial-access mode.

In the usual random-access mode, row addresses and column addresses are successively supplied from an address buffer 5 and are respectively decoded in a row decoder 6 and column decoders 11 to 14 so as to obtain addresses of the memory cell arrays 1 to 4. The four data of four bits are respectively read from the same addresses of the memory cell arrays 1 to 4. This four data of four bits are respectively passed through I/O gates of sense amplifiers 15 to 18 and are transferred to I/O buffers 21 to 24 wherein the four data of four bits are outputted to external devices as four output data IO0 to IO3.

On the other hand, write-in data IO0 to IO3 for the memory cell arrays 1 to 4 are read from the I/O buffers 21 to 24 and are supplied to the I/O gates of sense amplifiers 15 to 18 by an unit of four bits. The write-in data IO0 to IO3 are respectively written into the same addresses of the memory cell arrays 1 to 4. Thus, it becomes possible to simultaneously write the four data of four bits into the same arbitrary addresses of the four memory cell arrays 1 to 4 and simultaneously read the four data therefrom. As the usual RAM, this dual port memory can read and write the data at random.

Next, description will be given with respect to the serial-access mode. The memory cell arrays 1 to 4 are respectively connected to data registers 31 to 34 each of which has a word length of 256 bits. Hence, it is possible to transfer the data of one row to the memory cell arrays 1 to 4 at one time. More specifically, four data written into the memory cell arrays 1 to 4 are respectively transferred to the data registers 31 to 34 by one row (in a read-data transferring operation), and four serial-data inputted to the data registers 31 to 34 are respectively transferred and written into the memory cell arrays 1 to 4 by one row (in a write-data transferring operation).

In addition, pointers 35 to 38 are respectively attached to the data registers 31 to 34 for determining which bit within 256 bits is inputted and outputted (as a bit address). These pointers 35 to 38 are respectively constituted as shift registers of 256 bits wherein a column address supplied from the address buffer 5 is set as an initial value (or an initial bit). This initial bit is shifted by one bit based on a serial control clock SC and is outputted as the bit address for the data registers 31 to 34.

In case of a serial output operation, four read-data transferred to the data registers 31 to 34 are respectively and successively transferred to serial I/O buffers 41 to 44 wherein the four read-data are started to be stored therein from the bit address. And, the serial I/O buffers 41 to 44 output the four read-data as serial output data SD0 to SD3. On the other hand, in case of a serial input operation, the serial data SD0 to SD3 are respectively passed through the serial I/O buffers 41 to 44 and are successively inputted in series to the data registers 31 to 34 wherein the serial-data SD0 to SD3 are inputted in the bit addresses thereof assigned by the pointers 35 to 38. After the serial inputting operation is completed, the data registers 31 to 34 transfer all of the write-data into the memory cell arrays 1 to 4 at one time. Thus, it becomes possible to perform serial I/O operation from an arbitrary bit address of the row data.

In FIG. 6, 45 designates a clock generator started by a row address strobe signal RAS or a column address strobe signal CAS, 46 designates a refresh address counter for outputting a refresh address, 47 designates a write clock generator for outputting a clock in a data writing cycle, and 48 designates a transfer controller for controlling a data transfer performed between the memory cell arrays 1 to 4 and the data registers 31 to 34.

FIG. 7 is a timing chart showing an operation of the conventional dual port memory. When an usual random-access operation is performed, a value of an output enable signal OE becomes "0" (hereinafter, an expression such as "a value of a signal becomes "0" or "1"" will be simply referred to as another expression such as "a signal becomes "0" or "1"" in the present specification) at a rising time of a row address strobe signal RAS so as to assign that the random-access operation will be started (as shown in FIG. 7(f)). At the same time, the row addresses of the memory cell arrays 1 to 4 are assigned (as shown in FIG. 7(c)). In addition, the column addresses are assigned at a time when the column address strobe signal CAS rises. Thus, it is permitted to transfer data between the memory cell arrays 1 to 4 and the data registers 31 to 34, however, usual read-out and write-in operations can be performed. In other words, the row addresses are set in the row decoder 6 and the column addresses are respectively set in the column decoders 11 to 14 by the signals RAS and CAS. Hence, the data IO0 to IO3 of four bits are executed to be read from and written into the memory cell arrays 1 to 4 wherein the data IO0 to IO3 are read from and written into the addresses thereof assigned by the above row addresses and column addresses (as shown in FIG. 7(e)).

Next, the output enable signal OE becomes "1" (which indicates that the data are transferred) and a write enable signal WE becomes "0" (which indicates "a reading condition") at a rising time of the signal RAS. At the same time, it is assigned to transfer the read-data, and the row addresses are assigned so that the present operating cycle is put into a data transfer cycle. Then, the output enable signal OE is falling down so that the memory cell arrays 1 to 4 transfer all of the row data assigned by the row addresses to the data registers 31 to 34 at one time as read-data. In this case, the column addresses are used for initializing serial output start addresses to the pointers 35 to 38.

As shown in FIG. 7(g) to FIG. 7(i), serial data transferred into the data registers 31 to 34 are outputted while a serial enable signal SE is kept "1". In other words, the bit addresses of the pointers 35 to 38 are respectively renewed by one based on the serial control clock SC. The data registers 31 to 34 respectively output the data thereof assigned by the bit addresses via the serial I/O buffers 41 to 44 as serial-data SD0 to SD3 of four bits. On the other hand, serial-data inputted into the data registers 31 to 34 are written into the memory cell arrays 1 to 4 by a transfer of write-data.

In above conventional dual port memory, however, following disadvantages (1) to (3) are occurred. (1) In the case where the serial-data are to be outputted continuously as shown in FIGS. 7(f) and 7(g), the output enable signal OE must be synchronized with the serial control clock SC. For example, both of times $t_{SDD}$ and $t_{SDH}$ are set to times more than 10 ns. Thus, a timing synchronization is required and it is difficult to design the dual port memory.

(2) It is impossible to reload partial row data of the memory cell arrays 1 to 4 with serial-data. In order to perform this reloading operation, above row data are firstly transferred to the data registers 31 to 34 as read-data, and the serial-data are inputted into the data registers 31 to 34 so as to only exchange the data in reloading portion of the arrays 1 to 4. The data registers 31 to 34 transfer the serial-data to the original rows of the memory cell arrays 1 to 4 as write-data. However, it is only permitted to output the serial-data and it is impossible to input the serial-data after the memory cell arrays 1 to 4 transfer read-data to the data registers 31 to 34 in the conventional dual port memory. Hence, the conventional dual port memory suffers a problem in that the partial row data can not be reloaded.

(3) It is impossible to input serial-data sequentially. In other words, the serial-data must be stopped to be inputted while all of the serial write-data stored in the data registers 31 to 34 are transferred to the memory cell arrays 1 to 4 at one time. Hence, the conventional dual port memory suffers a problem in that the serial-data can not be sequentially inputted thereto.

SUMMARY OF THE INVENTION

The present invention is believed to be provided under a consideration of above problems described heretofore, and several objects and a brief summary of the present invention will now be set forth.

(1) It is a general object of the invention to provide a memory device in which it is unnecessary to synchronize the output enable signal for designating the data transfer with the serial control clock for stepping the serial I/O operation.

(2) It is another object of the invention to provide a memory device in which the serial-data can be inputted to a predetermined portion of the row data while the remaining portion other than the predetermined portion is maintained as it is.

(3) It is a still another object of the invention to provide a memory device in which the serial-data can be sequentially inputted thereto.

(4) It is a further object of the invention to provide a memory device in which a serial run-out signal is outputted so that the display controller can exactly catch a timing of an exchange of serial I/O operation at every time when the serial I/O operation of the row data is completed.

According to one aspect of the invention, there is provided a memory device for an image display apparatus comprising: memory cell arrays of M rows and N columns, a series of data stored in one row of each memory cell array being divided into first data of K columns and second data of N-K columns (where M, N and K represent positive integral numbers); one couple of first and second data registers, the first data register being used for independently transferring the first data while the second data register is used for independently transferring the second data, one of the first and second data registers being selected and alternately used for performing serial input and output operations; pointers for assigning or initializing serial input and output positions in the first and second data registers; and execution means for selecting one of the first and second data registers and for executing a data transfer between the memory cell arrays and selected one of the first and second data registers based on the serial input and output positions.

According to another aspect of the invention, there is provided a memory device for an image display apparatus providing a serial port for inputting and outputting serial-data and a random port for performing a random-access from a central processing unit, the central processing unit performing accesses to the memory device via a display controller for outputting control signals to the memory device, the memory device comprising: memory cell arrays of M rows and N columns, a series of data stored in one row of each memory cell array being divided into first data of K columns and second data of N-K columns (where M, N and K denote positive integral numbers); one couple of first and second data registers, said first register being used for serially inputting and outputting the first data while the second data being transferred between the memory cell arrays and the second data register in a first serial cycle, and the second data register being used for serially inputting and outputting the second data while the first data being transferred between the memory cell arrays and the first data register in a second serial cycle, an operation in the first serial cycle and another operation in the second serial cycle being performed repeatedly so as to serially input and output the first and second data sequentially; pointers for assigning or initializing serial input or output positions in the first and second data registers so as to determine start addresses from which the first and second data are read from or written into the first and second data register; and execution means for selecting one of the first and second data registers based on the control signals from the display controller and for executing a data transfer between the memory cell arrays and selected one of the first and second data registers.

BRIEF DESCRIPTION OF THE DRAWINGS

Further objects and advantages of the present invention will be apparent from the following description, reference being had to the accompanying drawings wherein a preferred embodiment of the present invention is clearly shown.

In the drawings:

FIG. 4 is a timing chart for explaining a data transfer operation;

DESCRIPTION OF THE PREFERRED EMBODIMENTS OF THE INVENTION

Figure 1:
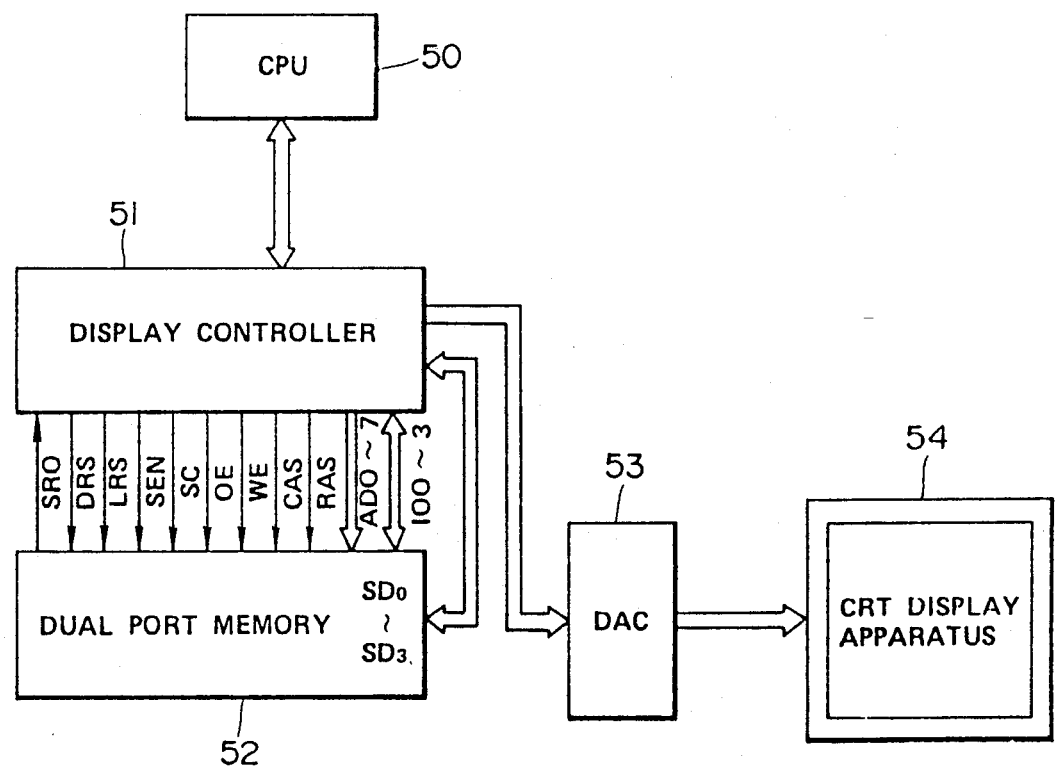
FIG. 1 is a block diagram showing a whole constitution of an image display apparatus which employs a memory device of an embodiment of the invention.

Referring now to the drawings, wherein like reference characters designate like or corresponding parts throughout the several views.

WHOLE CONSTITUTION OF THE IMAGE DISPLAY APPARATUS

FIG. 1 is a block diagram showing the whole constitution of the image display apparatus which employs a memory device of an embodiment of the invention. In FIG. 1, 50 designates a CPU which supplies commands and data required for displaying to a display controller 51 and which accepts responses to data and commands within a memory device 52 (hereinafter, simply referred to as a memory 52) supplied from the display controller 51.

The image data are stored in the memory 52 by the display controller 51, and the display controller 51 generates several kinds of timing signals such as a horizontal synchronizing signal, a vertical synchronizing signal and serial control clock and other signals. Furthermore, the display controller 51 successively reads out a series of display data from the memory 52 and supplies the read-out data to a DAC (a digital-to-analog converter) 53 as a digital signal. The DAC 53 converts the digital signal to an analog signal and supplies the analog signal to a CRT display apparatus 54 wherein an image corresponding to the analog signal is displayed on a screen thereof. As shown in FIG. 1, control lines, address lines and data lines are connected between the display controller 51 and the memory 52, however, description thereof will be described later.

CONSTITUTION OF THE EMBODIMENT

Figure 2:
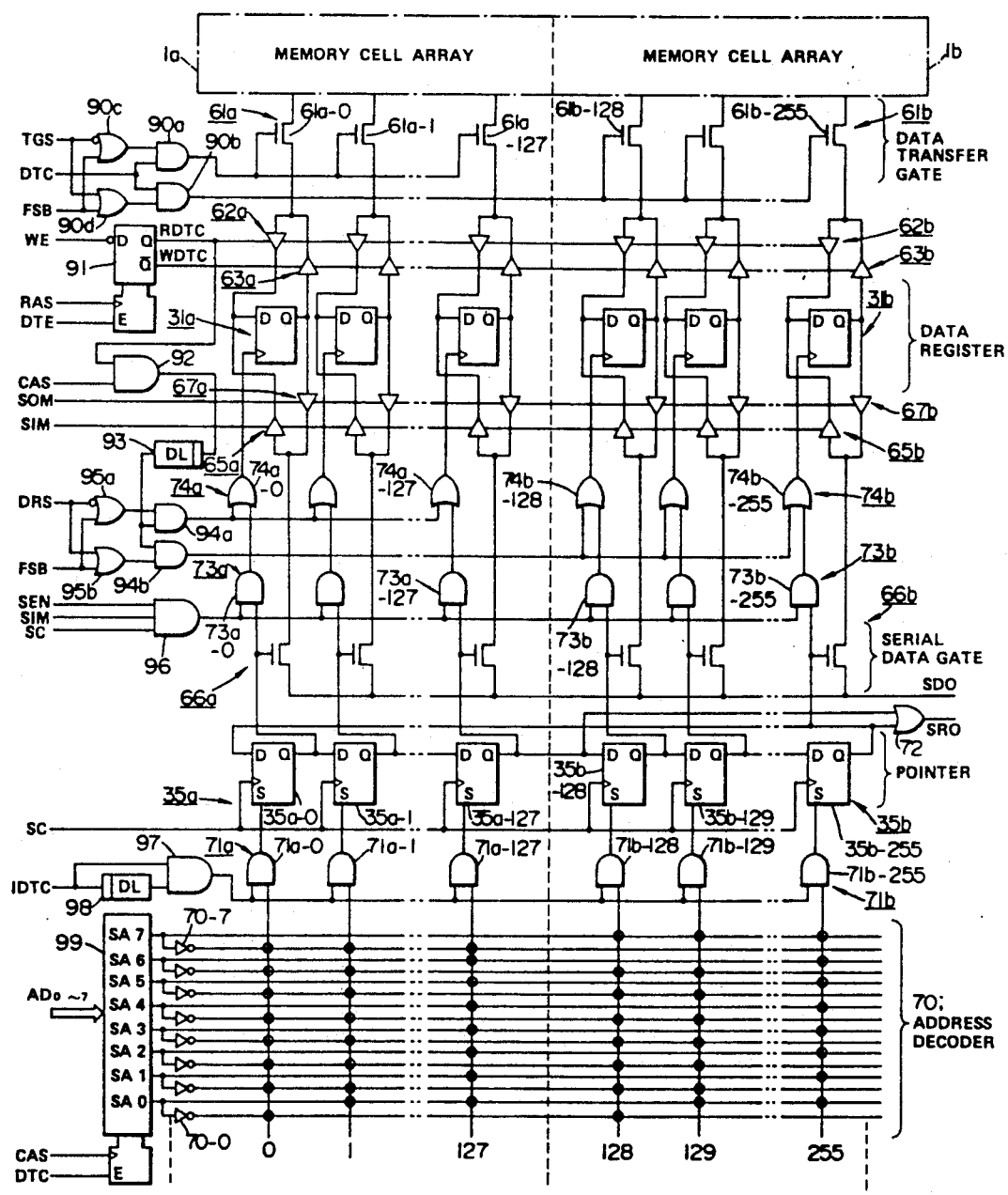
FIG. 2 is a circuit diagram showing an essential constitution of the memory device of an embodiment of the invention.

FIG. 2 is a block diagram showing a constitution of a serial system of the memory 52. In FIG. 2, 1a and 1b respectively designate memory cell arrays of 256 rows and 256 columns which correspond to the memory cell array 1 shown in FIG. 6. In the present embodiment, four couples of memory cell arrays (1a, 1b) to (4a, 4b) are provided. However, each couple of memory cell arrays has the same constitution thereof, hence, description will be given only with respect to one couple of memory cell arrays (1a, 1b). In addition, column addresses of the memory cell arrays 1a and 1b are respectively expressed as characters i and j (where i=0 to 127, and j=128 to 255). Furthermore, in the case where the constitutional elements are to be shown corresponding to the row addresses, such constitutional elements will be shown as 31a-i and 31b-j.

In FIG. 2, 31a (or 31b) designates the data register constituted by one hundred and twenty eight D flip-flops each of which is represented by the D flip-flop 31a-i (or 31b-j). The data registers 31a and 31b correspond to the data register 31 shown in FIG. 6. Data transfer gates 61a and 61b and data buffers 62a and 62b are inserted in series between respective data input terminals D of the data registers 31a and 31b and the memory cell arrays 1a and 1b. In addition, data buffers 63a and 63b and the data transfer gates 61a and 61b are inserted in series between respective output terminals Q of the data registers 31a and 31b and the memory cell arrays 1a and 1b. Hence, the data can be transferred between the memory cell arrays 1a and 1b and the data registers 31a and 31b.

In the above description, the data transfer gate 61a (or 61b) is constituted by one hundred and twenty eight gate elements each of which is represented by the gate element 61a-i (or 61b-j). Similarly, the data buffers 62a, 62b, 63a and 63b are constituted by respective four groups of three state buffers in which each group includes one hundred and twenty eight buffers. Each buffer within the data buffer 62a (or 62b) is represented by the buffer 62a-i (or 62b-j), and similarly, each buffer within the data buffer 63a (or 63b) is represented by the buffer 63a-i (or 63b-j).

Figure 6:
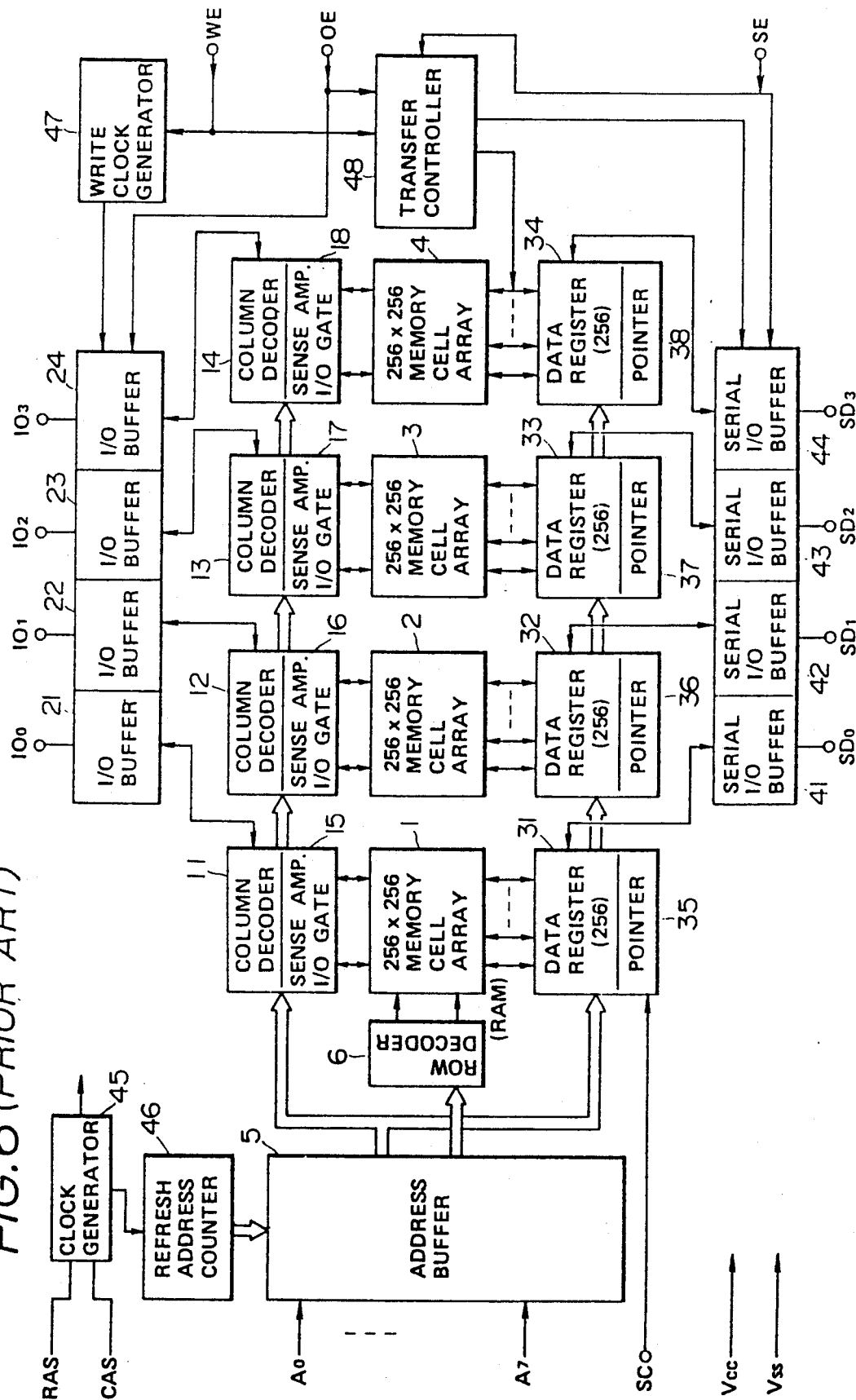
FIG. 6 is a block diagram showing a constitution of the conventional dual port memory.
Figure 7:
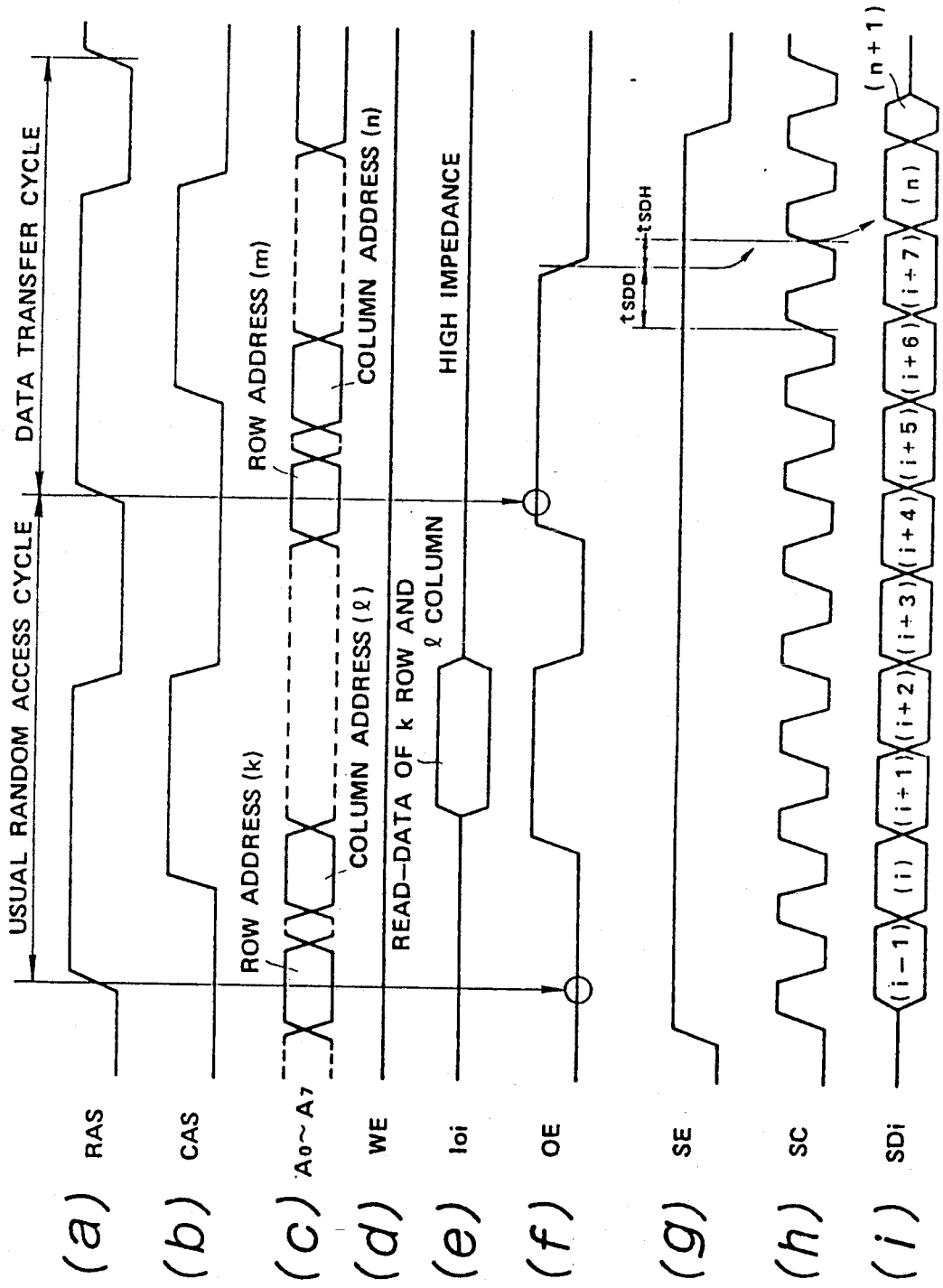
FIG. 7 is a timing chart for explaining the operation of the conventional dual port memory shown in FIG. 6.

The respective data input terminals D of the data registers 31a and 31b are connected to the serial I/O buffer 41 shown in FIG. 6 via data buffers 65a and 65b and serial data gates 66a and 66b in series. Similarly, the respective data output terminals Q of the data registers 31a and 31b are connected to the serial I/O buffer 41 via data buffers 67a and 67b and the serial data gates 66a and 66b. As a result, one data buffer among the data buffers 65a, 65b, 67a and 67b is selected and turned on, and gate elements 66a-i and 66b-j of the serial data gates 66a and 66b are turned on, so that serial data SD0 can be transferred between eh data registers 31a-i and 31b-j and the serial I/O buffer 41.

Next, description will be given with respect to a constitution of a circuit for controlling a transfer of the serial-data. First, a couple of pointers 35a and 35b is provided for assigning the bit addresses i and j of the data registers 31a and 31b. The pointers 35a and 35b correspond to the pointer 35 shown in FIG. 6, and the pointer 35a (or 35b) is constituted by one hundred and twenty eight D flip-flops so that the initialization can be performed therein. More specifically, an address decoder 70 converts address data AD0 to AD7 of eight bits into the bit addresses of 256 bits, and such bit addresses are outputted to set terminals S of D flip-flops 35a-i and 35b-j within the pointers 31a and 31b via AND gates 71a-i and 71b-j. At this time, the state of either one from the D flip-flop 35a-i or 35b-j is set to "1" and "1" signal (a bit address signal) is generated. This "1" signal is shifted by one bit to the upper bit based on the serial control clock SC which is supplied to clock terminals of the D flip-flops 35a-i and 35b-j. In this case, output signals of the D flip-flops 35a-127 and 35b-255 correspond to the most significant bits in a serial I/O cycle. This output signals are supplied to input terminals of OR gate 72 so that the OR gate 72 outputs a serial runout signal SRO for assigning that the serial I/O operation is completed.

On the other hand, output signals are respectively outputted from output terminals Q of the D flip-flops which constitute the pointers 35a and 35b, and these output signals are respectively supplied to control terminals of gate elements 66a-i and 66b-j within the serial data gates 66a and 66b and are also supplied to respective clock terminals of the elements 31a-i and 31b-j within the data registers 31a and 31b via AND gates 73a-i and 73b-j and OR gates 74a-i and 74b-j in series. As a result, the serial-data SDO can be transferred between a serial I/O buffer 41 and the data register 31a-i (or 31b-j) corresponding to the pointer 35a-i (or 35b-j) which outputs the bit address ("1" signal).

In the serial output cycle, the bit data of the data registers 31a (or 31b) is passed through the output terminal Q of the D flip-flop 31a-i (or 31b-j, the data buffer 67a-i (or 67b-j) and the serial data gate 66a-i (or 66b-j) in series and is finally supplied to the serial I/O buffer 41. In the serial input cycle, the bit data of the serial I/O buffer 41 is passed through the serial data gate 66a-i (or 66b-j) and the data buffer 65a-i (or 65b-j) in series and is finally supplied to the data input terminal D of the D flip-flop 31a-i (or 31b-j). On the other hand, the pointer 35a-i (or 35b-j) supplies a bit address signal to the clock terminal of the data register 31a-i (or 31b-j) via the AND gate 73a-i (or 73b-j) and the OR gate 74a-i (or 74b-j) in series. Hence, the above bit data is inputted to the data register 31a-i (or 31b-j) based on the bit address signal.

Figure 3:
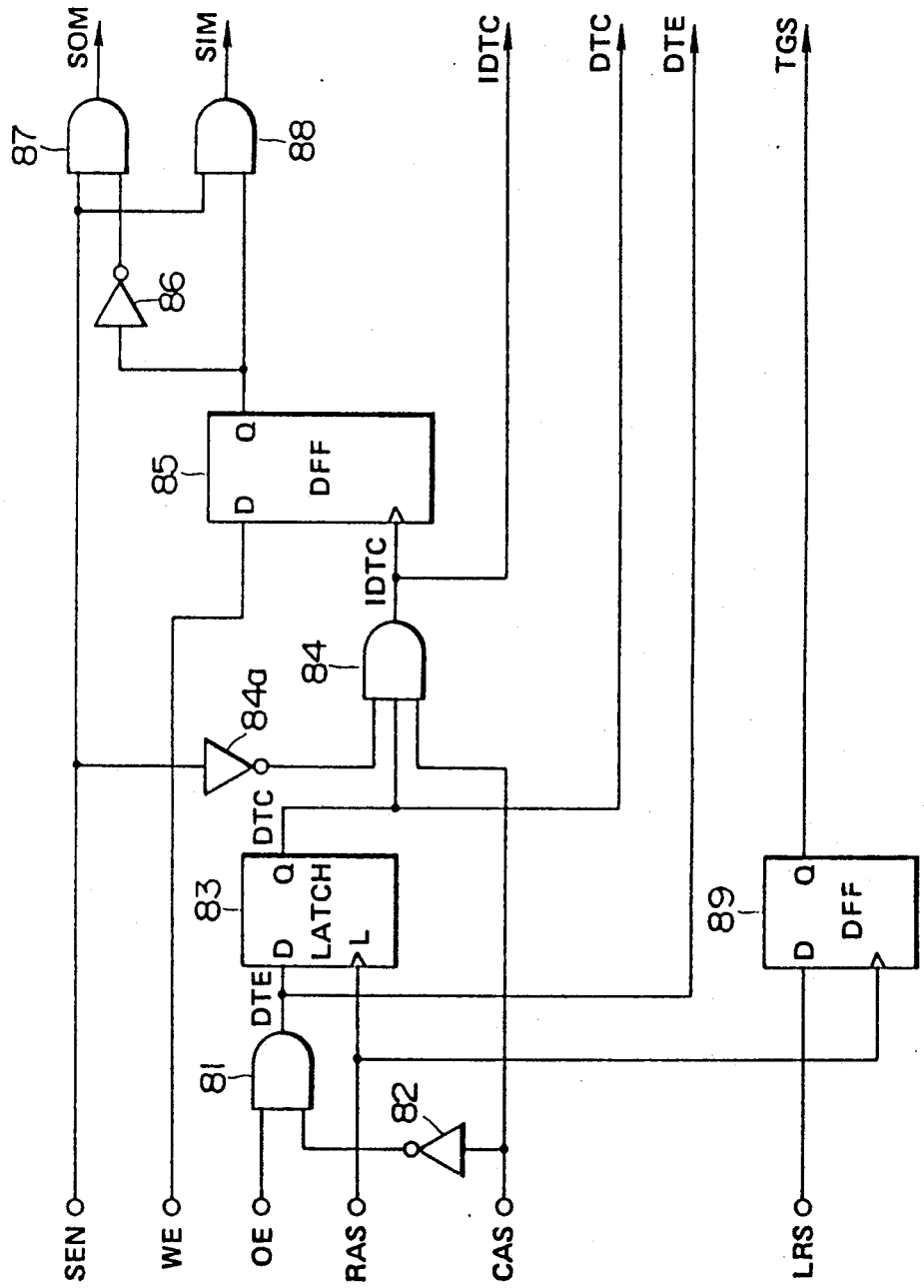
FIG. 3 is a block diagram showing a circuit which generates main control signals for the memory device.

Next, description will be given with respect to control signals of the memory 52. FIG. 3 is a block diagram showing a constitution of a circuit for generating main control signals.

In FIG. 3, the output enable signal OE is supplied to a first input terminal of an AND gate 81. An inverter 82 supplies an inverted signal of the column address strobe signal CAS to a second input terminal of the AND gate 81. The AND gate 81 outputs a data transfer enable signal DTE to a data input terminal D of a latch circuit 83. The row address strobe signal RAS is supplied to a latch terminal L of the latch circuit 83, wherein the signal DTE is latched to obtain a data transfer control signal DTC when the level of the signal RAS becomes "1".

The data transfer control signal DTC is outputted from the Q terminal of the latch circuit 83 and is supplied to an AND gate 84 wherein a logical product thereof will be obtained based on the signal CAS, an inverted signal of the serial enable signal SEN and the signal DTC. The AND gate 84 outputs and supplies the logical product to a clock terminal of the D flip-flop 85 as a signal IDTC. A write enable signal WE is supplied to an input terminal D of the D flip-flop 85 wherein the signal WE is inputted based on the signal IDTC.

When the "1" signal is inputted to the D flip-flop 85 for assigning the serial input operation, the "1" signal is inverted in an inverter 86, and the inverted signal is supplied to both of second input terminals of AND gates 87 and 88. The serial enable signal SEN is supplied to both of first input terminals of the AND gates 87 and 88. Hence, the AND gate 87 outputs a serial output mode signal SOM, and the AND gate 88 outputs a serial input mode signal SIM.

Next, a selecting signal LRS and the row address strobe signal RAS are respectively supplied to a data input terminal D and a clock terminal of a D flip-flop 89 wherein the selecting signal LRS is inputted therein at a leading edge of the signal RAS. Hence, a transfer gate selecting signal TGS is obtained from the output terminal Q of the D flip-flop 89. In this case, the selecting signal LRS is used for selecting either one of the memory cell arrays 1a and 1b and is transferred from the display controller 51 to the memory 52. The memory cell array 1a will be selected when the signal LRS becomes "0", and the memory cell array 1b will be selected when the signal LRS becomes "1".

Referring back to FIG. 2 again, the above transfer gate selecting signal TGS is directly supplied to a first input terminal of an OR gate 90d, and the inverted signal of the signal TGS is supplied to a first input terminal of an OR gate 90c. In addition, the OR gate 90c supplies an output signal thereof to a first input terminal of an AND gate 90a, and the OR gate 90d supplies an output signal thereof to a first input terminal of an AND gate 90b. Furthermore, the data transfer control signal DTC is supplied to both of second input terminals of the AND gates 90a and 90b wherein output signals thereof are respectively supplied to control terminals of the data transfer gates 61a and 61b. As a result, in the case where the signal TGS becomes "1" and the signal DTC becomes "1", the AND gate 90b output "1" signal and the gate element 61b-j within the data transfer gate 61b is turned on, so that the data can be transferred between the memory cell array 1b and the data register 31b. On the other hand, in the case where the signal TGS becomes "0" and the signal DTC becomes "1", the AND gate 90a outputs the "1" signal so that the data can be transferred between the memory cell array 1a and the data register 31a.

A full serial buffer signal FSB is supplied to input terminals of the OR gates 90c and 90d. When the signal FSB becomes "1", both of the OR gates 90c and 90d output the "1" signal, regardless of the value of the signal TGS. Hence, when the signal DTC becomes "1", the AND gates 90a and 90b simultaneously output the "1" signal so as to open both of the data gates 61a and 61b. As a result, it becomes possible to transfer the data between the memory cell arrays 1a and 1b and the data registers 31a and 31b.

Next, 91 designates a D flip-flop for selecting one of the read-data transfer and the write-data transfer. The inverted signal of the write enable signal WE and the row address strobe signal RAS are supplied respectively to the data input terminal D and the clock terminal of the D flip-flop 91 wherein the signal WE is inputted thereto at a leading edge of the signal RAS. In this case, the signal RAS will be valid only when the data transfer enable signal DTE is supplied to the enable terminal E of the D flip-flop 91 and becomes "1". As a result, when the signal WE becomes "0" in a data transfer command, the output terminal Q of the D flip-flop 91 becomes "1" so that a read-data transfer control signal RDTC is outputted from the output terminal Q. On the other hand, when the signal WE becomes "1" in the data transfer command, the output terminal $\overline{Q}$ of the D flip-flop 91 becomes "1" so that a write-data transfer control signal WDTC is outputted from the output terminal $\overline{Q}$. Hence, when the signal RDTC is outputted, the data buffers 62a and 62b become enable so that the read-data can be transferred. Similarly, when the signal WDTC is outputted, the data buffers 63a and 63b become enable so that the write-data can be transferred.

Next, an AND gate 92, a delay element 93, AND gates 94a and 94b, and OR gates 95a and 95b perform control operations with the OR gates 74a and 74b. In one of the control operations, either one of an a-route (constituted by the memory cell array 1a and the data register 31a, etc.) and a b-route (constituted by the memory cell array 1b and the data register 31b, etc.) is selected and the read-data will be transferred in either one of the a-route or b-route.

First, the read-data transfer control signal RDTC and the column address strobe signal CAS are both inputted to the AND gate 92 wherein the logical product of the signal RDTC by the signal CAS is obtained and is supplied to both of first input terminals of the AND gates 94a and 94b via the delay element 93. And, second input terminals of the AND gates 94a and 94b are respectively supplied with output signals of the OR gates 95a and 95b. The OR gates 95a and 95b are provided for selecting either one of the a-route and b-route. The OR gate 95a outputs the "1" signal when the data register selecting signal DRS becomes "0", and the OR gate 95b outputs the "1" signal when the signal DRS becomes "1". In addition, when the full serial buffer signal FSB becomes "1", both of the OR gates 95a and 95b output the "1" signal, regardless of the level of the signal DRS.

As a result, the signal CAS rises in the read-data transfer cycle and a predetermined delay time is passed, and thereafter, the delay element 93 outputs the "1" signal. At this time, the AND gates 94a and 94b are opened by the output signals of the OR gates 95a and 95b, and the AND gates 94a and 94b output the "1" signals. These "1" signals are respectively passed through the OR gates 74a and 74b and are respectively supplied to the clock terminals of the elements 35a-i and 35b-j within the data registers 31a and 31b, so that the read-data will be transferred.

An AND gate 96 is provided for obtaining a logical product of the serial enable signal SEN, the serial input mode signal SIM and the serial control clock signal SC. The AND gates 73a and 73b are opened by the AND gate 96 at every time when the signal SC is inputted to the AND gate 96 in the serial input mode. Thus, the serial-data will be sequentially inputted to the element 31a-i (or 31b-j) of the data register 31a (or 31b) corresponding to the bit address assigned by the pointer 35a (or 35b). More specifically, the AND gate 73a-i (or 73b-j) is supplied with both of the "1" signal outputted from the AND gate 96 and other "1" signal for assigning the bit address which is outputted from the pointer 35a-i (or 35b-j). The "1" signal outputted from the AND gate 73a-i (or 73b-j) is passed through the OR gate 74a-i (or 74b-j) and is supplied to the clock terminal of the data register 31a-i (or 31b-j) wherein the serial-data are inputted thereto.

The signal IDTC is delayed in a delay element 98 to obtain a delayed signal, and an AND gate 97 is provided for obtaining a logical product of the signal IDTC by the delayed signal. As described in FIG. 3, the signal IDTC is used for inputting the serial input mode signal SIM and the serial output mode signal SOM to the D flip-flop 85, hence, the signal IDTC must be outputted just before the serial I/O mode is set. Due to the IDTC signal, the AND gates 71a and 71b are simultaneously opened, and one pointer 35a-i (or 35b-j) within the pointer 35a (or 35b) is supplied with the "1" signal outputted from the address decoder 70 and the one pointer 35a-i (or 35b-j) becomes "1", so that the start address will be initialized in the serial I/O cycle.

Finally, 99 designates a latch circuit for latching the address data AD0 to AD7 of eight bits. The address data AD0 to AD7 are inputted to the latch circuit 99 at a leading edge of the column address strobe signal CAS, and the latch circuit 99 outputs the address data as start addresses SA0 to SA7. These start addresses SA0 to SA7 are supplied to the input terminals of the address decoder 70 and are respectively inverted by the inverters 70-0 to 70-7. The inverted start addresses are supplied to another input terminals of the address decoder 70. In this case, the signal CAS becomes valid only when the data transfer control signal DTC becomes "1".

The constitution of the embodiment of the invention described above can be summarized into the following five points (1) to (5).

(1) It is possible to select and turn one of the data transfer gates 61a and 61b on by changing the level of the transfer gate signal TGS into "0" or "1". Thus, it becomes possible to select one of the a-route and b-route and transfer the data by selected one of the a-route and b-route. In addition, the level of the full serial buffer signal FSB is rendered to "1" so that the data can be transferred by the a-route and b-route in parallel.

(2) In the read-data transfer cycle, the data buffers 62a and 62b are rendered to become enable by the read-data transfer control signal RDTC. In the write-data transfer cycle, the data buffers 63a and 63b are rendered to become enable by the write-data transfer control signal WDTC.

(3) In the serial input cycle, the data buffers 65a and 65b are rendered to become enable by the serial input mode signal SIM. In the serial output cycle, the data buffers 67a and 67b are rendered to become enable by the serial output mode signal SOM.

(4) The pointers 35a and 35b assign the bit addresses in the serial I/O cycle, hence, the serial data is inputted into or outputted from the data registers 31a-i and 31b-j corresponding to the assigned bit addresses i and j. The start addresses are initialized in the pointers 35a and 35b by the signal outputted from the address decoder 70.

(5) When the pointers 35a and 35b assign the most significant bit addresses, the OR gate 72 outputs the serial run-out signal SRO. Hence, it is possible for the display controller 51 to recognize that the serial I/O route is changed from the a-route to the b-route or the serial I/O route is changed from the b-route to the a-route based on the signal SRO.

THE OPERATION OF THE EMBODIMENT

Next, description will be given with respect to the serial output mode, the serial input mode and the high speed copy mode in order in conjunction with FIGS. 1 to 4. Before describing about these modes, description will be firstly given with respect to the data transfer operation. In this case, the I/O operation of the random access system is similar to that of the conventional apparatus, hence, description thereof will be omitted.

Hereinafter, description will be referred only to the memory cell arrays 1a and 1b and the data registers 31a and 31b, because the same operation for inputting and outputting data of four bits will be performed in other memory cell arrays 2a to 4a and 2b to 4b and the data registers 32a to 34a and 32b to 34b as well.

As described before, the data transfer means an operation for transferring the data between the memory cell array 1a (or 1b) and the data register 31a (or 31b). The read-data transfer means an operation for transferring the read-data from the memory cell array to the data register, and the write-data transfer means an operation for transferring the write-data from the data register to the memory cell array. First, description will be given with respect to the read-data transfer.

[1] READ-DATA TRANSFER (a) The display controller 51 sets the levels of the selecting signal LRS and the data register selecting signal DRS to "0" when the read-data is to be transferred by the a-route, and the display controller 51 sets those of the signals LRS and DRS to "1" when the read-data is to be transferred by the b-route. The full serial buffer signal FSB is outputted when the read-data is transferred by both of the a-route and b-route.

The signal LRS is supplied to the data input terminal D of the D flip-flop 89 shown in FIG. 3, and the signal DRS is supplied to the OR gates 95a and 95b shown in FIG. 2. The a-route is selected when both of these signals LRS and DRS become "0", and the b-route is selected when both of these signals LRS and DRS become "1".

On the other hand, when the full serial buffer signal FSB is outputted, the signal FSB is supplied to the OR gates 90c, 90d, 95a and 95b so that the read-data can be transferred by both of the a-route and b-route.

(b) Next, the display controller 51 sets the level of the output enable signal OE to "1" (so that the data is transferred) and sets the level of the write enable signal WE to "0" (so that the data is read out). In addition, the display controller 51 outputs the row addresses to the address buses A0 to A7 and set the level of the row address strobe signal RAS to "1" (at a time t1 shown in FIG. 4). Thus, the memory 52 transfers the read-data (when the signal RDTC becomes "1") and set the row addresses for the read-data.

As a result, the AND gate 81 shown in FIG. 3 outputs a data transfer enable signal DTE (having the level of "1" in this case) which is a logical product signal of the output enable signal OE by the inverted signal of the column address strobe signal CAS. This signal DTE is supplied to the input terminal of the latch circuit 83 and the enable terminal of the D flip-flop 91 as well. In this case, when the signal RAS rises at the time t1 shown in FIG. 4, the signal DTE is latched in the latch circuit 83 and is outputted as a data transfer control signal DTC. In addition, the inverted signal (having the level of "1") of the write enable signal WE is inputted into the D flip-flop 91 wherein the read-data transfer control signal RDTC is outputted from the output terminal Q thereof so that the data buffers 62a and 62b become enable. The signal DTC is supplied to both of the AND gates 90a and 90b. The row addresses AD0 to AD7 are inputted into the memory 52, as is the same to the conventional memory.

At the time t1, the selecting signal LRS is inputted into the D flip-flop 89 wherein the level of the transfer gate selecting signal TGS is set to "0" or "1". This signal TGS is used for opening either one of the data transfer gates 61a and 61b (in either one of the a-route and the b-route). The signal TGS is supplied to the AND gates 90a and 90b via the OR gates 90c and 90d. When the signal TGS becomes "0", the data transfer gate 61a in the a-route is selected. When the signal TGS becomes "1", the data transfer gate 61b in the b-route is selected.

On the other hand, in the case where the display controller 51 outputs the full serial buffer signal FSB, both of the data transfer gates 61a and 61b are turned on so that the data can be transferred in both of the a-route and b-route.

(c) Next, the display controller 51 selects the serial I/O operation and determines the start address thereof at a time t2 shown in FIG. 4.

More specifically, the display controller 51 outputs the start addresses for the serial I/O operation to the address buses A0 to A7. In addition, the display controller 51 sets the level of the write enable signal WE to "0" or "1". This signal WE is used for assigning serial I/O directions. Furthermore, the serial output mode is selected when the signal WE becomes "0", and the serial input mode is selected when the signal WE becomes "1". The display controller 51 raise the level of the column address signal CAS to "1" at the time t2 shown in FIG. 4. Thus, the serial I/O directions and the start addresses in the serial I/O cycle are determined in the memory 52. In other words, either one of the serial input mode signal SIM and the serial output mode signal SOM is selected and outputted from the memory 52.

Further more specifically, when the display controller 51 raises the column address strobe signal CAS at the time t2, the start addresses AD0 to AD7 are latched in the latch circuit 99 and are decoded in the address decoder 70. Hence, the "1" signal ( one output signal within two hundred and fifty six output signals of the address decoder 70 becomes "1") is outputted from the address decoder 70 and is supplied to the AND gate 71a-i (or 71b-j).

At the time t2, the IDTC signal is outputted from the AND gate 84 shown in FIG. 3 and is supplied to both of the AND gate 97 and the delay element 98. A predetermined delay time is passed after the time t2, and thereafter, the AND gate 71a-i (or 71b-j) will be opened so that the start address is initialized in the pointer 35a-i(or 35b-j).

At the time t2, the write enable signal WE is inputted into the D flip-flop 85 shown in FIG. 3 by the signal IDTC so that one of the serial input mode and the serial output mode is selected. More specifically, when the write enable signal WE becomes "1", the output signal from the terminal Q of the D flip-flop 85 becomes "1" so that the AND gate 88 will be able to output the serial input control signal SIM. On the other hand, when the signal WE becomes "0", the output signal from the terminal Q of the D flip-flop 85 becomes "0" so that the AND gate 87 will be able to output the serial output control signal SOM.

(d) Hence, the preparation for the read-data transfer is completed in the above operations. At a time when a predetermined delay time is passed after the time t2 (after a leading edge time of the signal CAS), the delay element 93 outputs the "1" signal. Hence, the AND gates 94a and 94b are opened, and the "1" signal is supplied to clock terminals of the data registers 31a and 31b via the OR gates 74a and 74b. Therefore, all of the row data of the memory cell arrays 1a and 1b are transferred to the data registers 31a and 31b at one time. Thus, the read-data transfer is executed.

[2] WRITE-DATA TRANSFER

The write-data transfer differs from the read-data transfer in the following two points (a) to (b).

(a) The display controller 51 sets the level of the write enable signal WE to "1" (which indicates the data write cycle) and also sets the level of the output enable signal OE to "1" (which indicates the data transfer cycle), and furthermore, the display controller 51 raises the level of the row address strobe signal RAS to "1" at the time t1 shown in FIG. 4.

(b) Hence, the write-data transfer control signal WDTC is outputted from the output terminal $\overline{Q}$ of the D flip-flop 91 so that the data buffers 63a and 63b become enable. As a result, a series of the write-data are outputted from the data registers 31a and 31b and are transferred to the rows of the memory cell arrays 1a and 1b via the data transfer gates 61a and 61b at one time.

As same as the read-data transfer, the operations for transferring the data by one of the a-route and b-route or for transferring the data by both of the a-route and b-route are performed based on the signals LRS, DRS, TGS and FSB.

Above is the operation for the data transfer. Next, description will be given with respect to the serial output mode, the serial input mode and the high speed copy mode in conjunction with FIGS. 5A–5C.

[I] SERIAL OUTPUT MODE

Figure 5A:
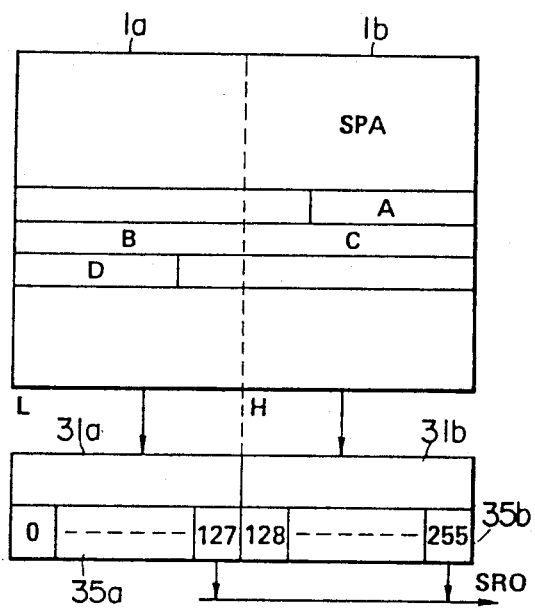
FIGS. 5A-5C shows conceptional illustrations for respectively explaining a serial output mode, a serial input mode and a high speed copy mode.

First, description will be given with respect to the serial output mode by considering an example shown in FIG. 5(a). In this example, the four data A to D stored in the memory cell arrays 1a and 1b will be serially read out in a sequence of the data A, B, C and D. In this case, the data A are started from the start point SPA. The display controller 51 can catch the end address of the data D by counting the serial control clock SC.

(1) PREPARATION FOR SERIAL OUTPUT OPERATION

The display controller 51 first sets the level of the selecting signal LRS to "0" so as to select the a-route, and the memory cell array 1a transfers the data B to the data register 31a. In this case, the start address of the data B is not assigned. In other words, all of the output levels of the pointers 35a are set to "0".

Next, the display controller 51 sets the level of the selecting signal LRS to "1" so as to select the b-route, and the memory cell array 1b transfers the data A to the data register 31b. In this case, the start address of the data A is the address SPA. This start address SPA is inputted into the latch circuit 99 at the leading edge of the column address strobe signal CAS and is supplied to only one pointer 35b-j via the decoder 70. At the same time, the write enable signal WE (which becomes "0" in the present serial output cycle) is read into the D flip-flop 85 wherein the "0" signal is outputted from the output terminal Q thereof.

(2) START OPERATION FOR SERIALLY OUTPUTTING DATA A

In the above condition, when the display controller 51 sets the level of the serial enable signal SEN to "1", the serial output mode signal SOM is outputted from the AND gate 87 and is supplied to the enable terminals of the data buffers 67a and 67b. As a result, the output signals of the data registers 31a and 31b are supplied to the serial data gates 66a and 66b. One gate within the serial data gates 66a (or 66b) is assigned by the bit address of the pointer 35a (or 35b) and the one gate is turned on. In this case, one pointer 35b-j corresponding to the start address SPA of the data A outputs the "1" signal so that one serial data gate 66b-j is turned on. Hence, the data register 31b-j outputs the serial-data to the serial I/O buffer 41.

At this time, the display controller 51 supplies the serial control clock SC to the clock terminals of the pointers 35a and 35b so that the "1" signal for the pointer 35b-j is shifted to the upper bit by one bit. Thus, the serial data gate 66b-j+1 is turned on, and the serial-data outputted from the data register 31b-j+1 are transferred to the serial I/O buffer 41. Similarly, the bit address of the pointer 35b is sequentially shifted by one bit so that the data A stored in the data register 31b are sequentially read out and are serially outputted via the serial I/O buffer 41.

When the data A are completely outputted, the most significant pointer 35b-255 outputs and supplies the "1" signal to the lowest pointer 35a-0 and the OR gate 72. As a result, the lowest pointer 35a-0 is set to "1". Hence, the data B are started to be serially outputted, and the serial run-out signal SRO is outputted from the OR gate 72 and is supplied to the display controller 51.

(3) SERIAL OUTPUT OPERATION FOR DATA B, AND TRANSFER OF DATA C

When the serial run-out signal SRO is inputted into the display controller 51, the display controller 51 commands to transfer the data C. More specifically, the display controller 51 outputs the row address for the data C. At the same time, the output enable signal OE becomes "1" (which indicates the data transfer cycle), the write enable signal WE becomes "0" (which indicates the data read cycle). In addition, the display controller 51 raises the level of the row address strobe signal RAS so that the row address for the data C is determined in the read-data transfer cycle.

At this time, all of the levels of the selecting signals LRS and DRS and the transfer gate selecting signal TGS are kept to "1". Hence, the OR gate 90d and the AND gate 90b successively output the "1" signals so that the data transfer gate 61b will be opened. In addition, the "1" signal is outputted from the OR gate 95b and is supplied to the AND gate 94b. Furthermore, the read-data transfer control signal RDTC is outputted from the output terminal Q of the D flip-flop 91 so that the data buffers 62a and 62b become enable.

In this case, when the display controller 51 raises the level of the column address strobe signal CAS, the "1" signal is outputted from the AND gate 94b after a predetermined delay time of the delay element 93 is passed.

Hence, the row data C of the memory cell array 1b are inputted into the data register 31b.

Thus, the data C are transferred to the data register 31b while the data B is serially outputted from the data register 31a.

(4) SERIAL OUTPUT OPERATION FOR DATA C, AND TRANSFER OF DATA D

When the data register 31a has completely outputted the data B serially, the "1" signal is outputted from the most significant D flip-flop 35a-127 within the pointer 35a and is supplied to the lowest D flip-flop 35b-128 in the b-route and the OR gate 72 as well. Hence, the data C stored in the data register 31b will be started to be serially outputted, and the serial run-out signal SRO will be outputted from the OR gate 72 and will be supplied to the display controller 51.

The display controller 51 changes the level of the selecting signal LRS to "0" based on the serial run-out signal SRO so that the memory cell array 1a outputs the data D to the data register 31a. The transfer of the data D is performed as that of the data C.

(5) STOP OPERATION FOR SERIAL OUTPUT OPERATION

When all of the data D have been transferred, the display controller 51 sets the level of the serial enable signal SEN to "0". Hence, the AND gate 87 is closed and the serial output mode signal SOM becomes "0" so that the data buffers 67a and 67b are closed. Thus, the serial output operation is stopped.

As described heretofore, while the data register 31a (or 31b) performs the serial output operation, the other data register 31b (or 31a) performs the read-data transfer in the present embodiment. Hence, it is unnecessary to synchronize the output enable signal OE with the serial control clock SC, and it is possible to perform the serial output operation sequentially.

[II] SERIAL INPUT MODE

Figure 5B:
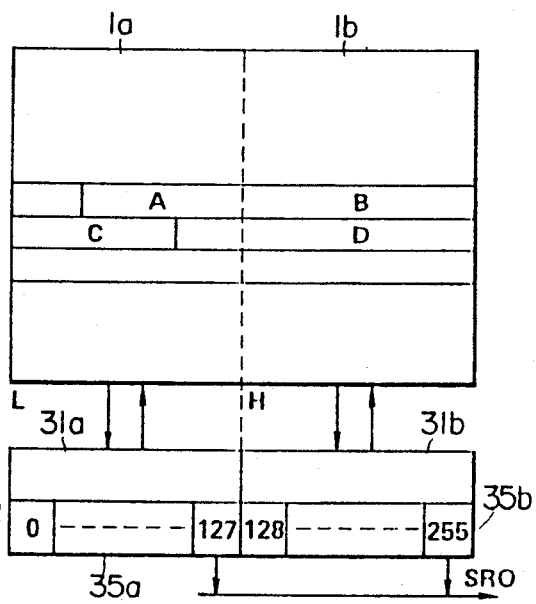

Next, description will be given with respect to the serial input mode by considering an example for serially inputting a series of data A to C in a sequence of the data A, B and C as shown in FIG. 5(b).

In this case, all data stored in predetermined rows of the memory cell arrays 1a and 1b are once transferred to the data registers 31a and 31b and several parts of the transferred data are reloaded by serial input data. Thereafter, the transferred and reloaded data in the data registers 31a and 31b are written into the above predetermined rows of the memory cell arrays 1a and 1b. Thus, the unreloaded portions of the row data other than the reloaded portion of the row data can be maintained. Hereinafter, in order to discriminate the data before the reloading operation from the data after the reloading operation, the data before the reloading operation will be referred to as data Aa, Ba and Ca.

In this case, the data A is started from the start address SPA, the display controller 51 detects the end address of the data C by counting the serial control clock SC. Finally, the same operation for serially inputting the data of four bits which is performed in a couple of memory cell arrays (1a, 1b) will be performed in other three couples of memory cell arrays (2a, 2b) to (4a, 4b), hence, the description thereof will be omitted.

(1) PREPARATION FOR SERIAL INPUT OPERATION

Firstly, the display controller 51 sets the level of the selecting signal LRS to "1" so that the data Ba is transferred from the memory cell array 1b to the data register 31b. Next, the display controller 51 changes the level of the selecting signal LRS to "0" so that the data Aa is transferred from the memory cell array 1a to the data register 31a. In this case, the start address of the data Aa is the address SPA. This address SPA is preset in the corresponding D flip-flop 35a-i within the pointer 35a by the column address strobe signal CAS.

Before the signal CAS is outputted, the display controller 51 sets the level of the write enable signal WE to "1" (which indicates the serial input cycle). Hence, the D flip-flop 85 is set to "1" at the leading edge of the signal CAS so that the AND gate 88 performs a preparation for outputting the serial input mode signal SIM.

(2) START OPERATION FOR SERIAL INPUT OPERATION

After the above preparation operation is completed, the display controller 51 sets the level of the serial enable signal SEN to "1". Hence, the AND gate 88 outputs the serial input mode signal SIM, and the data buffers 65a and 65b become enable. As a result, the serial data gates 66a and 66b are connected to input terminals of the data registers 31a and 31b. One gate within the serial data gates 66a and 66b is assigned by the bit address from the pointers 35a and 35b, and the one gate is turned on. In this case, the "1" signal is outputted from the pointer 35a-i which corresponds to the start address SPA of the data A so that the serial data gate 66a-i is turned on, and the serial I/O buffer 41 outputs and supplies the serial input data to the data register 31a-i.

Next, the serial control clock SC is outputted from the display controller 51 and is supplied to the AND gates 73a and 73b via the AND gate 96 so that the "1" signal is outputted from the AND gate 73a-i which is assigned by the pointer 35a-i. This "1" signal is supplied to the clock terminal of the data register 31a-i via the OR gate 74a-i, hence, the serial input data is inputted into the data register 31a-i. In addition, the serial control clock SC is supplied to the clock terminals of the pointers 35a and 35b, hence, the output "1" signal of the pointer 35a-i is shifted to the upper bit in turn. As a result, the data A inputted into the serial I/O buffer 41 is inputted into the sequential addresses started from the start address SPA in the data register 31a.

Thus, the data Aa stored in the data register 31a is sequentially reloaded from the start address SPA, and the serial input operation for the data A is completed. At this time the "1" signal is outputted from the most significant D flip-flop 35a-127 within the pointer 35a and is supplied to the lowest D flip-flop 35b-128 within the pointer 35b and the OR gate 72. As a result, the serial input operation for the data B is started, and the OR gate 72 outputs and supplies the serial run-out signal SRO to the display controller 51.

(3) WRITE-DATA TRANSFER FOR DATA A, AND READ-DATA TRANSFER FOR DATA Ca (IN SERIAL INPUT CYCLE FOR DATA B)

When the serial run-out signal SRO is supplied to the display controller 51, the display controller 51 commands to transfer the data A from the data register 31a to the memory cell array 1a.

In this case, when both of the write enable signal WE and the output enable signal OE become "1" and the row address strobe signal RAS rises, the D flip-flop 91 is set to "0" and the write-data transfer control signal WDTC is outputted from the output terminal $\overline{Q}$ of the D flip-flop 91, so that the data buffers 63a and 63b are opened.

Since the level of the selecting signal LRS is kept to "0" in the above condition, the transfer gate selecting signal TGS becomes "0". Hence, when the data transfer control signal DTC is outputted, the "1" signal is outputted from the AND gate 90a and all gates within the data transfer gate 61a are simultaneously opened, so that the content (,i.e., the data A) stored in the data register 31a is transferred to the memory cell array 1a.

Next, the display controller 51 prepares for a next serial output operation by transferring the data Ca from the memory cell array 1a to the data register 31a.

In the read-data transfer cycle for the data Ca, the data B is inputted into the data register 31b wherein the data Ba is sequentially reloaded. When the serial input operation for the data B is completed, the "1" signal is outputted from the most significant D flip-flop 35b-255 within the pointer 35b. This "1" signal is supplied to the lowest D flip-flop 35a-0 and the OR gate 72. As a result, the serial input operation for the data C is started, and the OR gate 72 outputs and transfers the serial run-out signal SRO to the display controller 51.

(4) WRITE-DATA TRANSFER FOR DATA B, AND READ-DATA TRANSFER FOR DATA Da (IN SERIAL INPUT CYCLE FOR DATA C)

As described in the above operation (3), when the serial run-out signal SRO is inputted to the display controller 51, the display controller 51 commands to transfer the data B from the data register 31b to the memory cell array 1b. Next, the data Da is transferred from the memory cell array 1b to the data register 31b.

At this time, the data C is continued to be serially inputted into the data register 31a and the data Ca stored in the data register 31a is reloaded.

(5) STOP OPERATION FOR SERIAL INPUT OPERATION

When it is detected that the serial input operation for the data C is completed, the display controller 51 sets the level of the serial enable signal SEN to "0" so as to assign to stop the serial input operation. Hence, the memory 52 closes the AND gate 88 and sets the level of the serial input mode signal SIM to "0" so that the serial input operation will be stopped.

(6) WRITE-DATA TRANSFER FOR DATA C AND DATA D

The data C is finally and serially inputted into the data registers 31a and 31b, and similarly, the data Da is transferred to the data registers 31a and 31b. Then the data registers 31a and 31b transfer the above data C and data Da to the memory cell arrays 1a and 1b. Thus, the serial input operation is completed.

As described before, while the data register 31a (or 31b) performs the serial input operation, the other data register 31b (or 31a) performs the read-data transfer and the write-data transfer in the present embodiment. Hence, it is possible to perform the serial input operation sequentially.

As described heretofore, the above read-data transfer is performed for maintaining the un-reloaded portion when the partial row data is reloaded. When it is obvious that all of the row data within the data B, for example, must be serially inputted, the above read-data transfer is not required.

[III] HIGH SPEED COPY MODE

Figure 5C:
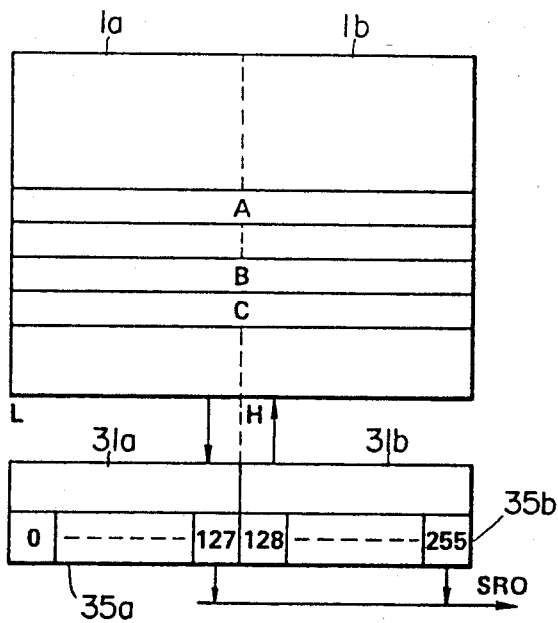

Next, description will be given with respect to the high speed copy mode by considering an example in which the data of the row address A is transferred to the row address B and the row address C in conjunction with FIG. 5(c).

(1) The display controller 51 first sets the level of the serial enable signal SEN to "0" and sets the level of the full serial buffer signal FSB to "1". Thus, both of the signals SIM and SOM become "0" so that the serial I/O operation will be stopped. At the same time, the "1" signals are outputted from the OR gates 90c, 90d, 95a and 95b so that the data transfer is prepared in both of the a-route and b-route.

(2) The display controller 51 commands to perform the read-data transfer at the row address A. Hence, the data transfer control signal DTC is outputted so that all of the data stored in the row address A of the memory cell arrays 1a and 1b are transferred to the data registers 31a and 31b at one time.

(3) Next, the display controller 51 transfers the contents stored in the data registers 31a and 31b to the row address B of the memory cell arrays 1a and 1b. Thereafter, the same contents described above are transferred to the row address C of the memory cell arrays 1a and 1b.

(4) When the write-data transfer has been completely performed to all of the assigned row addresses, the high speed copy mode is ended.

By use of this high speed copy mode, it is possible to perform a high speed copy transfer within the memory, hence, this mode is particularly valid for a process for scrolling the screen of the CRT display apparatus and other processes.

This invention may be practiced or embodied in still other ways without departing from the spirit or essential character thereof. In the present embodiment, a word length of 256 bits stored in one row of the memory cell array is divided into two equal word length portions in correspondence with the a-route and b-route. However, the present invention is not limited to that. For instance, in the case where the word length stored in one row of the memory cell array is determined to a word length of N bits, it is possible to assign the word length of K bits for the a-route and the word length of the N-K bits for the b-route as well (where N and K denote arbitrary positive integral numbers). Hence, the preferred embodiment described herein is therefore illustrative and not restrictive, the scope of the invention being indicated by the appended claims and all variations which come within the meaning of the claims are intended to be embraced therein.

What is claimed is:

1. A memory device for an image display apparatus, comprising:

(a) memory cell arrays of M rows and N columns, a series of data stores in one row of each memory cell array being divided into first data of K columns and second data of N-K columns (where M, N and K represent positive integral numbers);

(b) first and second data registers;

(c) first means for transferring said first data between said memory cell arrays and said first data register;

(d) second means independent of said first means for transferring said second data between said memory cell arrays and said second data register;

(e) means for inputting serial data into and outputting serial data from said first and second data registers;

(f) pointers for designating serial input and output positions in aid first and second data registers;

(g) means responsive to said pointers for selecting one of said first and second data registers and executing the transfer of data between said memory cell arrays and the selected one of said first and second data registers, said selecting and executing means including means responsive to said serial input and output positions designated by said pointers and causing the selection of one of said first or second data registers in response to a serial input or output position designated by said pointers, wherein said first means for transferring data includes a first transfer gate and a first data buffer connected in series between an input terminal of said first data register and said memory cell arrays and a first additional data buffer connected in series with said first transfer gate between an output terminal of said first data register and said memory cell arrays, said second means for transferring including a second transfer gate and a second data buffer connected in series between an input terminal of said second data register and said memory cell arrays, and a second additional data buffer connected in series with said second transfer gate between an output terminal of said second data register and said memory cell arrays.

2. A memory device according to claim 1 wherein M and N both equal 256 and K equals 128.

3. A device for providing signals to an image display apparatus comprising:

(a) a central processing unit;

(b) a memory device;

(c a display controller for accessing said central processing unit to said memory device;

wherein said memory device includes:

(i) memory cell arrays of M rows ad N columns, a series of data stores in one row of each memory cell array being divided into first data of K columns and second data of N-K columns (where M, N and K represent positive integral numbers);

(ii) a first data register;

(iii) a second data register;

(iv) means for serially inputting and outputting said first data through said first data register while said second data is transferred between said memory cell arrays and said second data register in a first serial cycle;

(v) means for serially inputting and outputting said second data through said second data register while said first data is transferred between said memory cell arrays and said first data register in a second serial cycle;

(vi) means for causing said first serial cycle and said second serial cycle to take place sequentially;

(vii) pointers for designating serial input and output positions in said first and second data registers so as to determine start addresses from which said first and second data are read from or written into said first and second data registers; and (viii) means for selecting one of said first and second data registers and for executing a data transfer between said memory cell arrays and the selected one of said first and second data registers;

(d) a first transfer gate and a first data buffer connected in series between an input terminal of said first data register and said memory cell arrays:

(e) a first additional data buffer connected in series with aid first transfer gate between an output terminal of said first data register and said memory cell arrays;

(f) a second transfer gate and a second data buffer connected in series between an input terminal of said second data register and said memory cell arrays, and (g) a second additional data buffer connected in series with said second transfer gate between an output terminal of said second data register and said memory cell arrays.

4. A memory device as described in claim 3 including an address decoder, each of said pointers being connected to said address decoder by an AND gate such that bit addresses can be outputted by said address decoder to said respective pointers via said respective AND gates.

5. A memory device as described in claim 4 including a serial control clock connected to each of said pointers.

6. A memory device as described in claim 5 wherein each of said data registers includes a clock terminal, each of said pointers being connected to each of said data registers by an AND gate and an OR gate in series therebetween.

7. A memory device for an image display apparatus, comprising:

(a) memory cell arrays of M rows and N columns, a series of data stored in one row of each memory cell array being divided into first data of K columns and second data of N-K columns (where M, N and K represent positive integral numbers);

(b) first and second data registers;

(c) first means for transferring first data between said memory cell arrays and said first data register, said first means for transferring including a first transfer gate and a first data buffer connected in series between an input terminal of said first data register and said memory cell arrays, and a first additional data buffer connected in series with said first transfer gate between an output terminal of said first data register and said memory cell arrays;

(d) second means independent of said first means for transferring second data between said memory cell arrays and said second data register, said second means for transferring including a second transfer gate and a second data buffer connected in series between an input terminal of said second data register and said memory cell arrays, and a second additional data buffer connected in series with said second transfer gate between an output terminal of said second data register and said memory cell arrays;

(e) means for inputting serial data into and outputting serial data from said first and second data registers including: a serial input/output buffer, a third data buffer and a first serial data gate connected in series between the input terminal or said first data register and said serial input/output buffer, a fourth data buffer and a second serial data gate connected in series between the input terminal of said second data register and said serial input/output buffer, a fifth data buffer and a third serial data gate connected in series between the output terminal of the first data register and the serial input/output buffer, and a sixth data buffer and a fourth serial data gate connected in series between the output terminal of the second data register and the serial input/output buffer;

(f) pointers for designating serial input and output positions in said first and second data registers, and (g) means responsive to said pointers for selecting one of said first and second data registers and executing the transfer of data between said memory cell arrays and the selected one of said first and second data registers, said selecting and executing means including means responsive to said serial input and output positions designated by said pointers and causing the selection of one of said first or second data registers in response to a serial input or output position designated by said pointers.

8. A memory device as described in claim 7 including an address decoder, each of said pointers being connected to said address decoder by an AND gate such that bit addresses can be outputted by said address decoder to said respective pointers via said respective AND gates.

9. A memory device as described in claim 8 including a serial control clock connected to each of said pointers.

10. A memory device as described in claim 9 wherein each of said data registers includes a clock terminal, each of said pointers being connected to each of said data registers by an AND gate and an OR gate in series therebetween.

11. A device for providing signals to an image display apparatus comprising:

(a) a central processing unit;

(b) a memory device;

(c) a display controller for accessing said central processing unit to said memory device;

wherein said memory device includes:

(i) memory cell arrays of M rows and N columns, a series of data stored in one row of each memory cell array being divided into first data of K columns and second data of N-K columns (where M, N and K represent positive integral numbers);

(ii) a first data register;

(iii) a second data register;

(iv) means for serially inputting and outputting said first data through said first data register while said second data is transferred between said memory cell arrays and said second data register in a first serial cycle;

(v) means for serially inputting and outputting said second data through said second data register while said first data is transferred between said memory cell arrays and said first data register in a second serial cycle;

(vi) means for causing said first serial cycle and said second serial cycle to take place sequentially;

(vii) pointers for designating serial input and output positions in said first and second data registers so as to determine start addresses from which said first and second data are read from or written into said first and second data registers, and (viii) means for selecting one of said first and second data registers and for executing a data transfer between said memory cell arrays and the selected one of said first and second data registers; and (d) an address decoder, each of said pointers being connected to said address decoder by an AND gate such that bit addresses can be outputted by said address decoder to said respective pointers via said respective AND gates.

12. A memory device as described in claim 11 including a serial control clock connected to each of said pointers.

13. A memory device as described in claim 12 wherein each of said data registers includes a clock terminal, each of said pointers being connected to each of said data registers by an AND gate and an OR gate in series therebetween.

* * * * *

UNITED STATES PATENT AND TRADEMARK OFFICE
CERTIFICATE OF CORRECTION

PATENT NO. : 5,170,157

DATED : December 8, 1992

INVENTOR(S) : Takatoshi Ishii

It is certified that error appears in the above-identified patent and that said Letters Patent is hereby corrected as shown below:

```
Column 7, line 1 - "between eh" should read
--between the --.

Column 19, line 9 - "aid" should read --said--.

Column 19, line 42 - "(c" should read --(c)--.

Column 19, line 45 - "ad" should read --and--.

Column 20, line 7 - after "arrays", delete ":" and
insert --;--.

Column 20, line 9 - "with aid first" should read
--with said first--.
```

UNITED STATES PATENT AND TRADEMARK OFFICE
CERTIFICATE OF CORRECTION

PATENT NO. : 5,170,157
DATED : December 8, 1992
INVENTOR(S) : Takatoshi Ishii It is certified that error appears in the above-identified patent and that said Letters Patent is hereby corrected as shown below:

Column 20, line 65 - "terminal or said" should read --terminal of said--.

Signed and Sealed this

Thirtieth Day of November, 1993

Attest:

BRUCE LEHMAN

*Attesting Officer*  *Commissioner of Patents and Trademarks*